US011808253B2

(12) United States Patent
Pettenon et al.

(10) Patent No.: US 11,808,253 B2
(45) Date of Patent: Nov. 7, 2023

(54) CONNECTION ARRANGEMENT OF MODULAR PUMP UNITS

(71) Applicant: SEACHEM LABORATORIES, INC., Madison, GA (US)

(72) Inventors: Paolo Pettenon, Cittadella (IT); Marco Pierobon, Padua (IT); Federico Carraro, Rubano (IT); James A Rogers, Madison, GA (US)

(73) Assignee: SEACHEM LABORATORIES, INC., Madison, GA (US)

( * ) Notice: Subject to any disclaimer, the term of this patent is extended or adjusted under 35 U.S.C. 154(b) by 317 days.

(21) Appl. No.: 17/266,125

(22) PCT Filed: Nov. 19, 2020

(86) PCT No.: PCT/IB2020/060925
§ 371 (c)(1),
(2) Date: Feb. 5, 2021

(87) PCT Pub. No.: WO2021/099991
PCT Pub. Date: May 27, 2021

(65) Prior Publication Data
US 2022/0112887 A1    Apr. 14, 2022

(30) Foreign Application Priority Data

Nov. 19, 2019   (IT) ................. 102019000021636

(51) Int. Cl.
*F04B 13/00*    (2006.01)
*A01K 63/04*    (2006.01)
(Continued)

(52) U.S. Cl.
CPC ............ *F04B 13/00* (2013.01); *A01K 63/047* (2013.01); *F04B 17/03* (2013.01); *F04B 43/12* (2013.01); *H05K 5/0052* (2013.01)

(58) Field of Classification Search
CPC .......... F04B 13/00; F04B 17/03; F04B 43/12; A01K 63/047; H05K 5/0052
See application file for complete search history.

(56) References Cited

U.S. PATENT DOCUMENTS 4,631,008 A    12/1986   Stenner
5,340,290 A    8/1994    Clemens
(Continued)

FOREIGN PATENT DOCUMENTS

BR    102016001270 A2  *  7/2017
CN    109240172 A          1/2019
(Continued)

OTHER PUBLICATIONS

English Machine Translation of CN-110406096-A (Year: 2019).*
(Continued)

*Primary Examiner* — Nathan C Zollinger
(74) *Attorney, Agent, or Firm* — Carmel Patent Agency; Robert J. Ballarini

(57) ABSTRACT

A metering unit for the controlled supply of a substance inside an aquarium tank comprises a containment box and a dosimetric pump which is actuated by an electric motor, both being associated with the containment box. The containment box has at least a first connection element and at least a second connection element which is suitable for being connected to a corresponding first connection element of an additional similar metering unit.

18 Claims, 5 Drawing Sheets

(51) Int. Cl.
  *F04B 17/03* (2006.01)
  *F04B 43/12* (2006.01)
  *H05K 5/00* (2006.01)

(56) References Cited

U.S. PATENT DOCUMENTS

| | | | | |
|---|---|---|---|---|
| 5,819,848 | A * | 10/1998 | Rasmuson | E21B 47/008 |
| | | | | 166/250.15 |
| 6,213,739 | B1 | 4/2001 | Phallen et al. | |
| 6,419,466 | B1 * | 7/2002 | Lowe | A47J 31/402 |
| | | | | 417/475 |
| 10,330,100 | B2 * | 6/2019 | Huang | F28F 13/06 |
| 2017/0099812 | A1 | 4/2017 | Chang | |
| 2018/0045188 | A1 * | 2/2018 | Spybey | F04D 13/14 |

FOREIGN PATENT DOCUMENTS

| | | | |
|---|---|---|---|
| CN | 110406096 A * | 11/2019 | |
| EP | 1085206 A1 | 3/2001 | |
| EP | 3306083 A1 | 4/2018 | |
| KR | 101670218 B1 * | 11/2016 | |

OTHER PUBLICATIONS

English Machine Translation of KR101670218B1 (Year: 2016).*
Agrowtek product brochure (http://agrowtek.com/doc/im/IM_ADi.pdf, archived Dec. 8, 2017, https://web.archive.org/web/20171208232123/http://agrowtek.com/doc/im/IM_ADi.pdf.) (Year: 2017).*
English Machine Translation of BR102016001270A2 (Year: 2017).*

\* cited by examiner

US 11,808,253 B2

CONNECTION ARRANGEMENT OF MODULAR PUMP UNITS

CROSS REFERENCE TO RELATED APPLICATIONS

The present application is a § 371 U.S. National Phase of PCT/IB2020/060925, filed Nov. 19, 2020, which claims priority of Italian patent application number 102019000021636, filed Nov. 19, 2019, the entire contents of all of which are incorporated by reference herein as if fully set forth.

FIELD OF THE INVENTION

The invention relates to a metering unit for the controlled supply of a substance, in particular for aquariums. The invention further relates to a metering unit which comprises a dosimetric pump and which can be used individually or can be connected to other metering units.

BACKGROUND

Different types of substances can be supplied by means of a dosimetric pump for aquariums, for example, substances, which inhibit the development of algae or fertilizers for aquatic flora.

It is known that it is necessary to introduce substances inside the tank of an aquarium at controlled doses and at regular intervals.

In order to meet this need, there have been launched on the market programmable metering units, which allow the automation of the operation for supplying substances over time inside the aquarium tank.

The metering units also comprise, in addition to the dosimetric pump per se, a containment box, which receives an electric motor and an electronic control unit. The unit is further connected to a power supply transformer, which allows the connection thereof to the electrical power network.

Similar devices are also used in other technical sectors, for example, the medical sector.

An example of a dosimetric pump, which is used in the above-mentioned units is described, for example, in U.S. Pat. No. 4,631,008A.

The metering units currently present on the market have a range of disadvantages.

Generally, the methods for connecting a plurality of metering units are ones, which provide for a connection with an electric wire or master/slave system.

Mainly metering units, which integrate therein a plurality of dosimetric pumps, as described, for example, in U.S. Pat. No. 6,213,739B1, are commercially available.

Therefore, the user has to decide in advance how many pumps he/she will have to have in the metering unit and this number cannot be modified in future.

The metering units sold individually do not in fact provide for a configuration in order to be able to be readily connected to other units.

Therefore, the problem addressed by the present invention is to provide a metering unit, which is structurally and functionally configured to at least partially overcome one or more of the disadvantages set out with reference to the cited prior art.

Another object of the invention is to provide a metering unit, which can be particularly versatile during use while maintaining a structure, which is generally simple.

This problem is solved by the invention by means of a metering unit, which is constructed according to one or more of the appended claims.

SUMMARY

It will be appreciated that the metering unit to which the invention relates comprises a containment box and a dosimetric pump, which is actuated by an electric motor. The containment box, with which the dosimetric pump and the electric motor are associated, has at least a first connection element and at least a second connection element which is suitable for being connected to the first connection element in such a manner that the metering unit can be connected in a modular manner to similar metering units.

In the context of the present invention, the term "modular connection" is intended to be understood to mean a connection, which is formed by metering units which are substantially identical or which have dimensions, which are substantially identical to each other.

The modularity of the connection allows the metering unit to be readily adapted to the different configurations, which are required for supplying a substance in a controlled manner inside an aquarium tank, it being found to be extremely versatile and simple to use. The greater the quantity of metering units connected, the greater is the quantity of substances which can be introduced in the aquarium tank.

The metering unit preferably comprises a printed circuit board which is positioned in the containment box, this printed circuit board comprising at least one electrical contact which faces at least one opening which is present in the containment box in such a manner that the at least one electrical contact of the metering unit is associated with the respective electrical contact of a similar metering unit.

Consequently, the connection between electrical contacts is brought about in a simple manner without using wires or other external devices.

According to yet another aspect, the invention also relates to a metering group, which comprises a plurality of metering units. Each metering unit of the group is provided for supplying a respective substance to the aquarium tank.

Preferably, the supply of the substance is carried out by means of a respective flexible tube of each metering unit, the ends of which are connected to respective extensions which are intended to be inserted in the aquarium tank and in a respective container, respectively, in which substances to be supplied are contained in such a manner that each metering unit supplies the substances independently of the others.

BRIEF DESCRIPTION OF THE DRAWINGS

The features and advantages of the invention will be better understood from the detailed description of a number of embodiments thereof which are illustrated by way of non-limiting example with reference to the appended drawings, in which.

DETAILED DESCRIPTION OF THE PREFERRED EMBODIMENTS

Figure 1A:
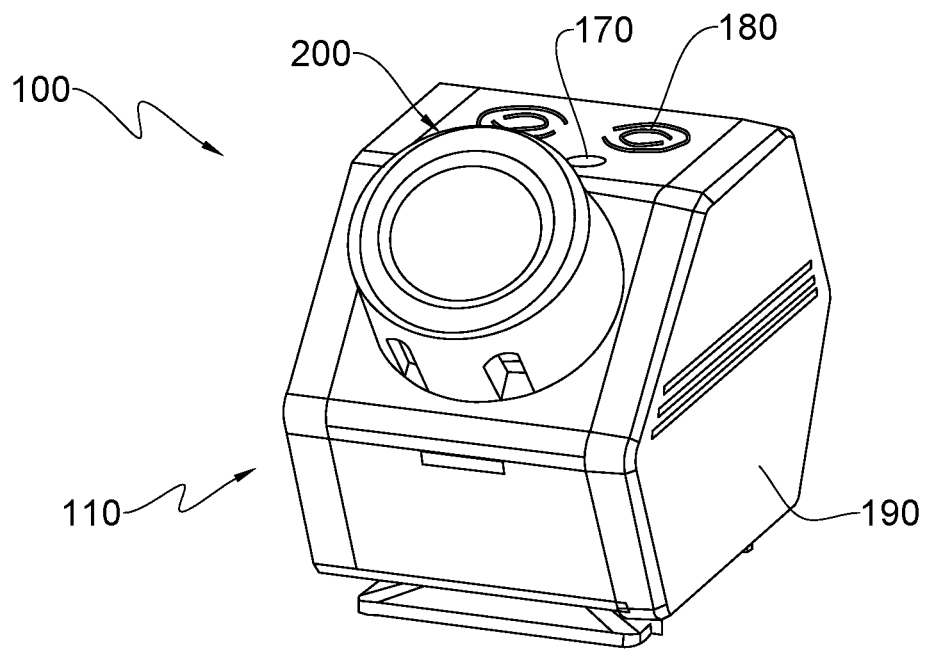
FIG. 1A is a perspective view of the metering unit.
Figure 1B:
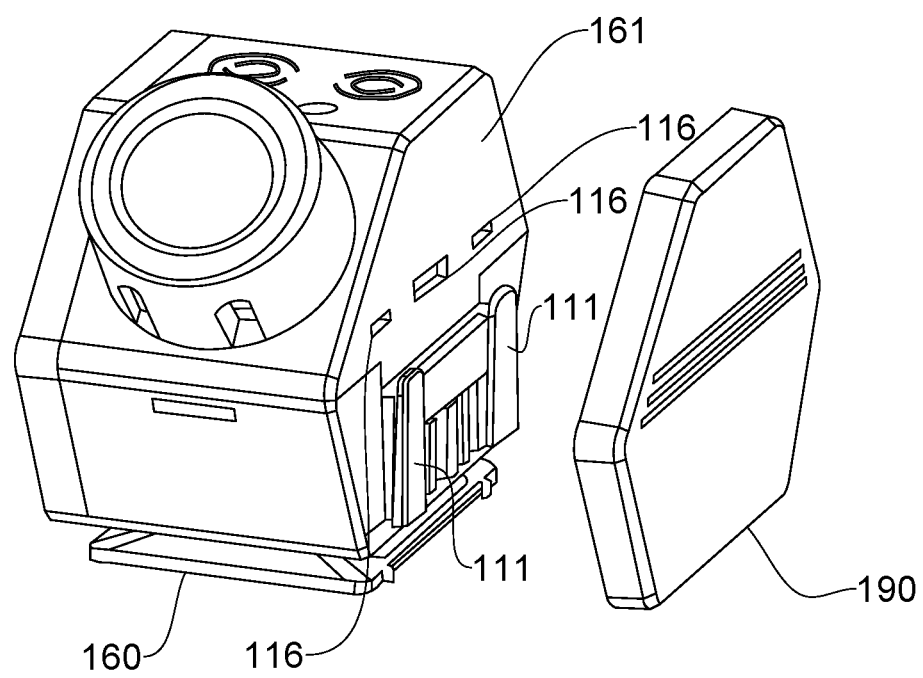
FIG. 1B is a perspective view of the metering unit with a lateral cover removed.

In the Figures, there is generally designated 100 the metering unit which allows the controlled supply of a substance inside an aquarium tank 10. As will be better appreciated below, the metering unit 100 of the present invention can be connected in a modular manner to similar metering units.

The metering unit 100 comprises a containment box 110. Preferably, the containment box 110 comprises an upper shell 120 and a lower shell 130, or more generally a first shell and a second shell. Preferably, both the shells have a box-like shape. In some embodiments, one shell or both shells has/have a tapered end.

On the basis of other aspects, the upper shell 120 may have a plurality of protuberances 117 which are suitable for being inserted in respective slots 135 which are present in the lower shell 130. In some embodiments, the protuberances 117 and the slots 135, in which the protuberances will be inserted, may be distributed differently on the upper shell 120 and on the lower shell 130. The connection between the two shells 120, 130 is preferably carried out by means of a threaded connection. To this end, there may be provided a cylinder 119, which is preferably constructed on the lower shell 130 in which a respective screw, which is not illustrated in the Figures and the head of which engages in the other shell at a threaded seat, engages.

The containment box 110 preferably comprises at least one external lateral surface 161, 162 and, even more preferably, there are provided two external lateral surfaces 161, 162. In some embodiments, there is provided at least one lateral cover 190 which can be applied removably to the containment box 110. Preferably, a lateral cover 190 is applied removably to each external lateral surface 161, 162 of the containment box 110.

The connection can be carried out by means of protuberances 191 which are present on the lateral cover 190 which can be inserted in respective slots 116 which are present in the external lateral surface 161, 162 of the containment box 110. In other embodiments, the protuberances 191 and the relevant slots 116, in which the protuberances 191 will be inserted, can be distributed differently on the containment box 110 and on the lateral cover 190.

The containment box 110 preferably comprises a support base 160. This base 160 allows the metering unit 100 to remain balanced on an approximately planar surface.

The containment box has at least one first connection element 111 and at least one second connection element 112 which is suitable for being connected to the first connection element 111 in such a manner that the metering unit 100 can be connected in a modular manner to similar metering units. In the exemplary embodiments in the Figures, each metering unit 100 has two first connection elements 111 which are constructed on a first lateral surface 131 of the lower shell 130 of the containment box 110 and two second connection elements 112 which are constructed on a second lateral surface 132 of the lower shell 130 of the connection box 110.

Preferably, the first connection element 111 is a male connection element, which will be inserted in the second connection element 112, in this case the female element.

For example, the male element 111 may comprise a protuberance, which engages with the female element 112, which comprises a channel. In some embodiments, as depicted by way of example in the Figures, there are present two male elements 111 which are suitable for being connected to two respective female elements 112 which are present on a similar metering unit. It may be noted that this type of connection is conceptually similar to a connection of the "dovetail" type and will be defined below as such, while the male element 111 deviates from a precisely trapezoidal form.

According to another aspect of the invention, the first connection element 111 and the second connection element 112 form a sliding connection, allowing ready engagement between metering units. Furthermore, such a connection allows continuity to be produced between two modules, which will in fact be completely beside each other.

In some embodiments, the first connection element 111 and the second connection element 112 are configured so as to define a connection direction between two units, which in the example illustrated in the Figures corresponds to a movement in a downward direction of one unit with respect to the other. In some examples, such as the one illustrated in the Figures, the protuberance of the male element 111 and the channel of the female element 112 can be developed in the above-mentioned connection direction.

In other embodiments, the connection can be brought about with different methods, for example, with a snap-fit connection.

Preferably, the connection between the first connection element 111 and the second connection element 112 is of the reversible type, that is to say, it is constructed so as to allow the coupling and subsequent separation of two containment boxes.

The containment boxes of the metering units preferably have corresponding dimensions so that, when they are connected in series to each other, they form a substantially continuous member. For example, it is possible to combine a plurality of metering units up to a limit of 256 pieces.

There are preferably received inside the containment box 110 a dosimetric pump 200, an electric motor 300 which is for actuating it and which is associated with a printed circuit board 400.

Preferably, the dosimetric pump 200 is a peristaltic pump.

In some embodiments, such as, for example, the one illustrated in the Figures, the printed circuit board 400 has a shape which is approximately rectangular and which has a plurality of electrical contacts 401, which are distributed on the first end 411 and on the second end 412 of the printed circuit board 400 in a manner opposite each other. There are preferably present four electrical contacts 401 on each end of the printed circuit board 400. The printed circuit board 400 is advantageously received inside the containment box in such a manner that the two ends on which the electrical contacts are present are facing the lateral surfaces, on which there are the connection elements 111 and 112.

In some embodiments, the printed circuit board 400 is connected to the lower shell 130 by means of a threaded connection. Preferably, the printed circuit board 400 is connected to the electrical network by means of a power socket 409. This power socket 409 can advantageously face the outer side of the containment box 110 through the rear opening 118. In the embodiment in the Figures, the rear opening 118 is formed on the lower shell 130.

According to another aspect of the invention, each electrical contact 401 faces at least one opening 115 which is present on the containment box 110. This allows the contacts 401 to project from the containment box 110 and to be able to be associated with the respective electrical contacts of a similar metering unit, which is intended to be connected.

Preferably, the electrical contacts 401 and the connection elements 111, 112 are configured in such a manner that, when two metering units are joined together by means of the mutual connection elements, the electrical contacts of a metering unit will be in contact with the electrical contacts of the other metering unit.

In some embodiments, the electrical contacts 401 are resiliently deformable towards the interior of the containment box 110 in such a manner that, when two units are joined, the respective contacts are urged against each other. Preferably, the contacts 401 further have an end 401A which is rounded towards the interior of the containment box 110 so as not to obstruct the connection steps between two units, particularly in the case in which there is a sliding connection. The opposite end 401B of the contact, that is to say, the end closest to the respective end of the board 400, can also be curved in such a manner that the contact between electrical contacts initially takes place at portions which protrude less with respect to the one in which the contact effectively takes place.

In general, the contacts 401 can be configured so as to vary the distance over which they project from the openings 115 in the connection direction defined by the connection elements 111, 112. Preferably, a central portion of the contact will project to a greater extent with respect to the ends so as to make the connection smoother between the two units without prejudicing the efficiency of the electrical contact.

The openings 115 are preferably constructed on the lateral surfaces 131, 132 of the lower shell 130. These openings 115 preferably have a vertical extent and a slot-like shape, which is substantially rectangular. In the embodiment illustrated, there are provided four openings 115 in the first lateral surface 131 of the lower shell 130 and four openings 115 in the second lateral surface 132 of the lower shell 130. In other embodiments, it can be constructed on the upper shell 120 and/or can have a different shape.

Preferably, the printed circuit board 400 is connected to a secondary printed circuit board 500. This connection can be, for example, carried out by means of a flat wiring harness, which is not illustrated. The secondary printed circuit board 500 preferably comprises at least one LED 501 and at least one push-button 502. In the embodiment illustrated, there are present two LEDs 501 and two push-buttons 502.

In some embodiments, the secondary printed circuit board 500 has a substantially trapezoidal shape. Preferably, the secondary printed circuit board 500 is received inside the upper shell 120 and even more preferably the secondary printed circuit board 500 is received in the tapered portion of the upper shell 120.

By way of example, the secondary printed circuit board 500 can be connected to the upper shell 120 by means of a threaded connection.

There are present in the external surface of the upper shell 120 holes 170 at the LEDs 501 and keys 180 at the push-buttons 502. In the embodiment illustrated, there are present two holes 170 and two keys 180.

The electric motor 300 is connected to the printed circuit board 400, which administers the actuation thereof on the basis of various parameters. The electric motor preferably comprises a shaft 301.

In some embodiments, the electric motor 300 is connected by means of a threaded connection to a front surface 125 of the upper shell 120 of the containment box 110. Preferably, the shaft 301 extends through a passage 126, which is present on the front surface 125 of the upper shell 120 so as to project outwards.

As may be observed in the Figures, the electric motor 300 can be connected to the upper shell 120 by means of a threaded connection.

According to other aspects of the invention, the dosimetric pump 200 comprises a head 201 and a support 202. Preferably, the head 201 and a support 202 have a unique coupling and are therefore integral.

In some embodiments, inside the head 201 of the dosimetric pump 200 there is present a flexible tube 204, which is bent in a U-shape and the ends of which project towards the exterior of the head 201. As may be appreciated from FIG. 5, the ends of the flexible tube 204 are preferably connected to respective extensions 204A, 204B which are intended to be inserted in the aquarium tank 10, respectively, in which the dosimetric pump 200 is used and in a container 11 in which the substances to be supplied are contained.

Preferably, the shaft 301 is suitable for being connected to the dosimetric pump 200, allowing the actuation thereof. Preferably, the end of the shaft 301 which projects from the hole 126 allows the actuation of a rotor which is not depicted and which is present inside the dosimetric pump 200. There are preferably associated with the rotor rollers, which throttle the respective sections of a flexible tube 204, which is bent into a U-shape inside the pump 200, allowing the circulation of the substance which is intended to be introduced into the tank of the aquarium.

Figure 3A:
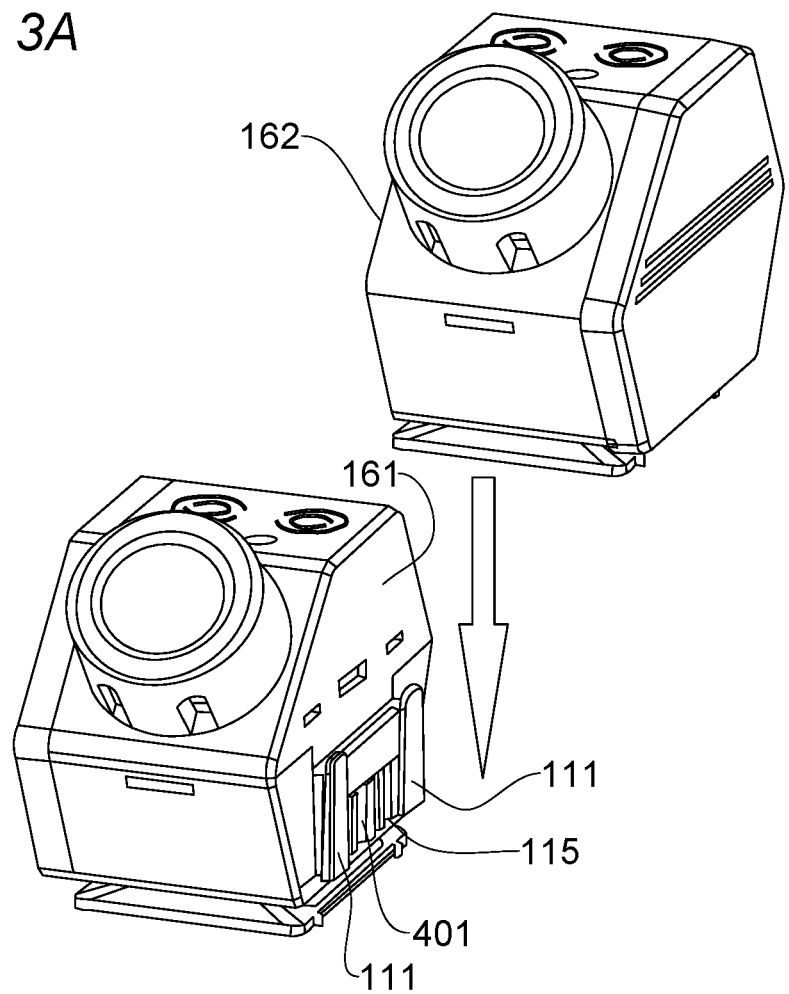
FIGS. 3A and 3B show a possible connection between two metering units.
Figure 3B:
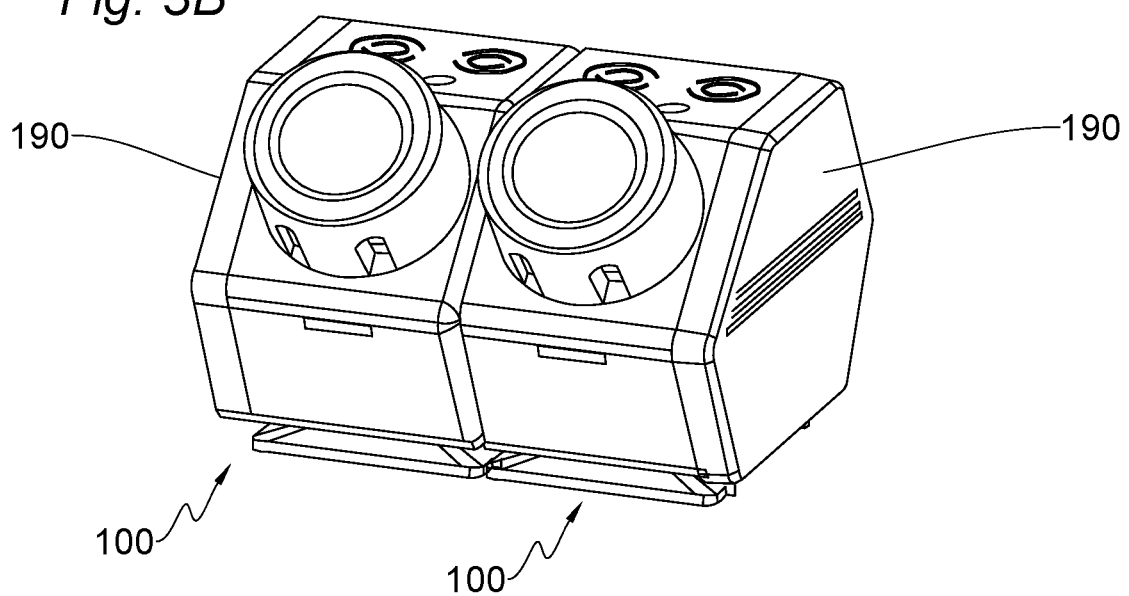
Figure 5:
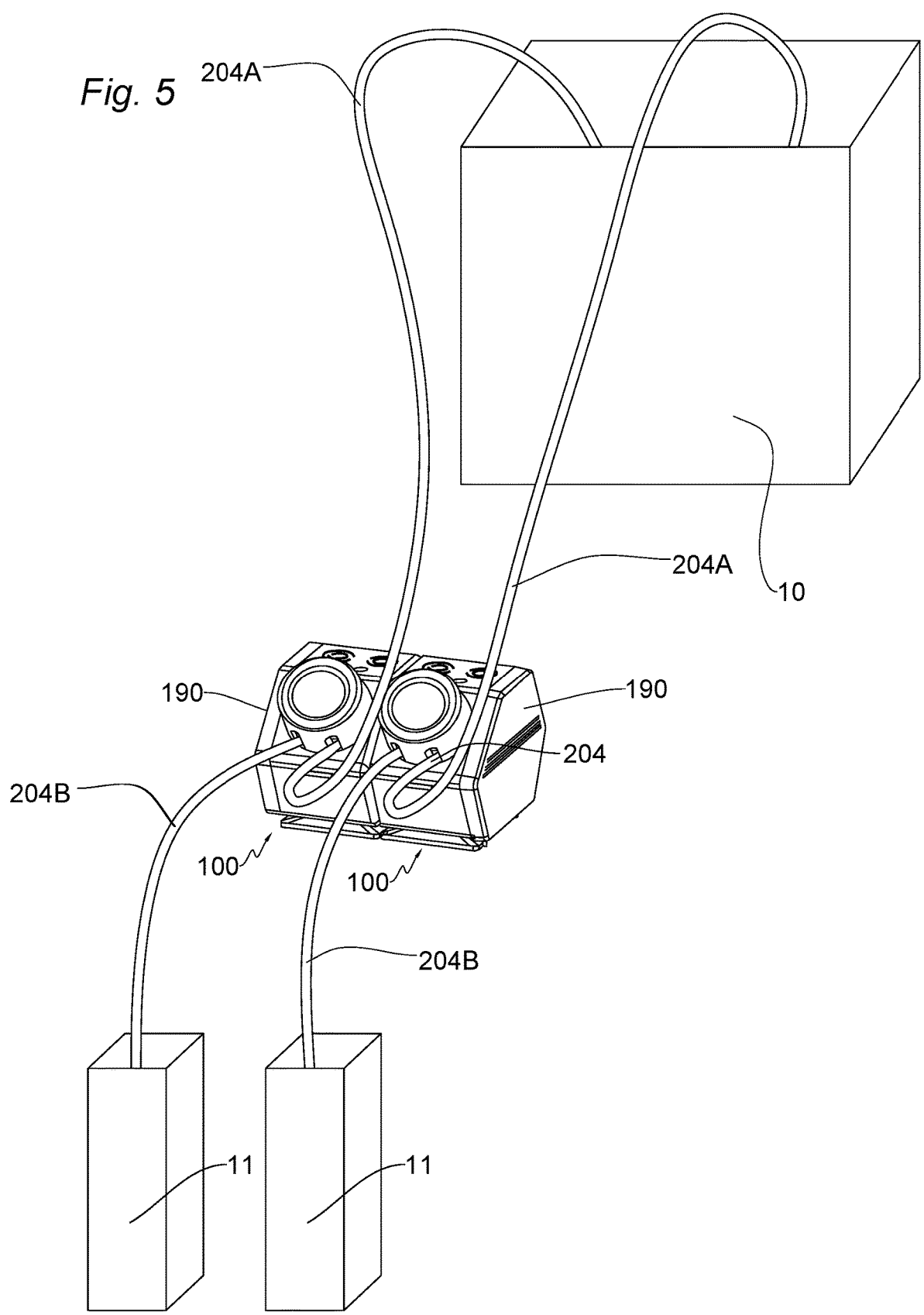
FIG. 5 is a schematic illustration, which illustrates the use of the metering unit in an aquarium.

According to an aspect of the invention, when two or more metering units 200 are connected to each other so as to form a metering group similar to the one illustrated in FIGS. 3B and 5, the supply of the substances by each unit is advantageously brought about independently of the others.

To this end, according to preferred embodiments, the supply of the substance may be carried out for each metering unit 200 by means of a respective flexible tube 204. Preferably, the ends of each tube 204 are connected to respective extensions 204A, 204B, which are intended to be inserted in the aquarium tank 10 and in a respective container 11, respectively, in which substances to be supplied are contained.

According to yet another aspect, the support 202 allows connection of the dosimetric pump 200 to the containment box 110. Advantageously, such a connection can be carried out in different positions in such a manner that the head 201, which is fixedly joined to the support 202 can rotate with respect to the containment box 110. Preferably, the head 201 can rotate with respect to the upper shell 120, even more preferably with respect to the front surface 125 of the upper shell 120.

In the embodiment illustrated, the support 202 comprises protuberances 203 which are suitable for being connected to slots 127 which are present in the containment box 110. Preferably, the slots 127 are constructed in the upper shell 120, even more preferably in the front surface 125 of the upper shell 120. Advantageously, these slots 127 are greater in number than the protuberances 203 in order to be able to connect the support 202 in different positions. The head 201, which is fixedly joined to the support 202 can therefore rotate with respect to the upper shell 120 on the basis of how the connection between protuberances 203 and slots 127 is brought about.

FIGS. 3A and 3B show the ease with which the user can connect two metering units 100. In order to assemble two or more units, it is simply necessary to remove the lateral covers 190 in order to be able to make the respective connection elements 111, 112 available. FIG. 3A shows the metering unit on the left provided with two male connection elements 111 which are connected to the respective female connection elements of the metering unit on the right, causing the unit to slide in a downward direction. FIG. 3B shows the two units, which are connected and aligned. The electrical contacts 401 of the left-hand unit which project from the openings 115 are connected to the respective electrical contacts of the right-hand unit.

Therefore, the metering unit according to the invention allows ease of adaption to the different configurations required for the controlled supply of a substance inside an aquarium tank, therefore being found to be extremely versatile and simple to use, as a result of the modularity thereof.

Figure 4:
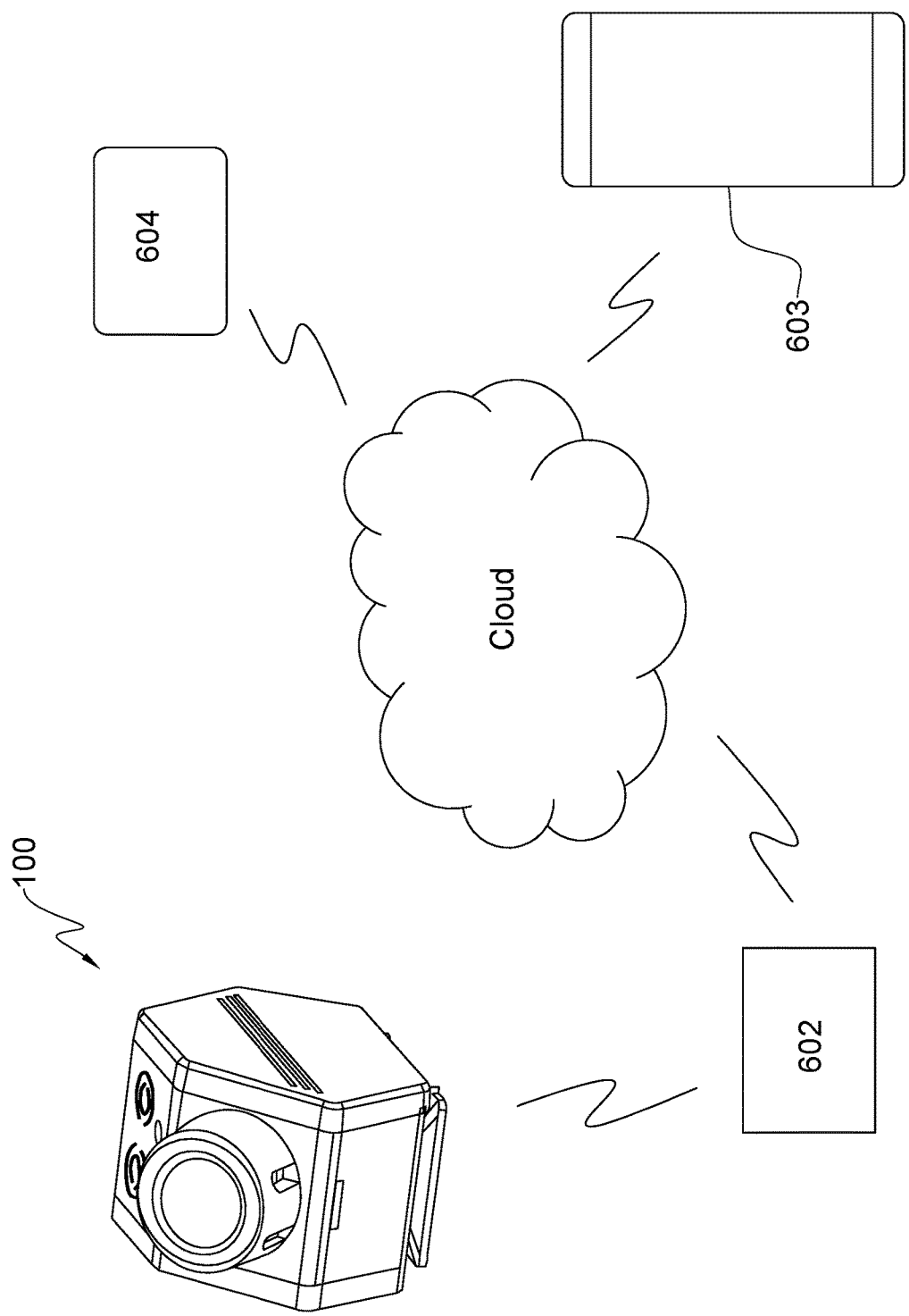
FIG. 4 schematically illustrates the "smart" functions which are connected with the metering unit.

According to another aspect of the invention, FIG. 4 schematically illustrates the "smart" functions, which are connected with the metering unit. These "smart" functions allow the user to monitor and control different parameters, which are linked with the substance to be supplied to the aquarium, for example, using a Smartphone or a computer.

The term "smart" is intended to be understood to refer to items of equipment which are connected to the Internet by means of a WiFi connection and which are accessible and controllable remotely by means of any computer or mobile device with a connection to the Internet.

Figure 2:
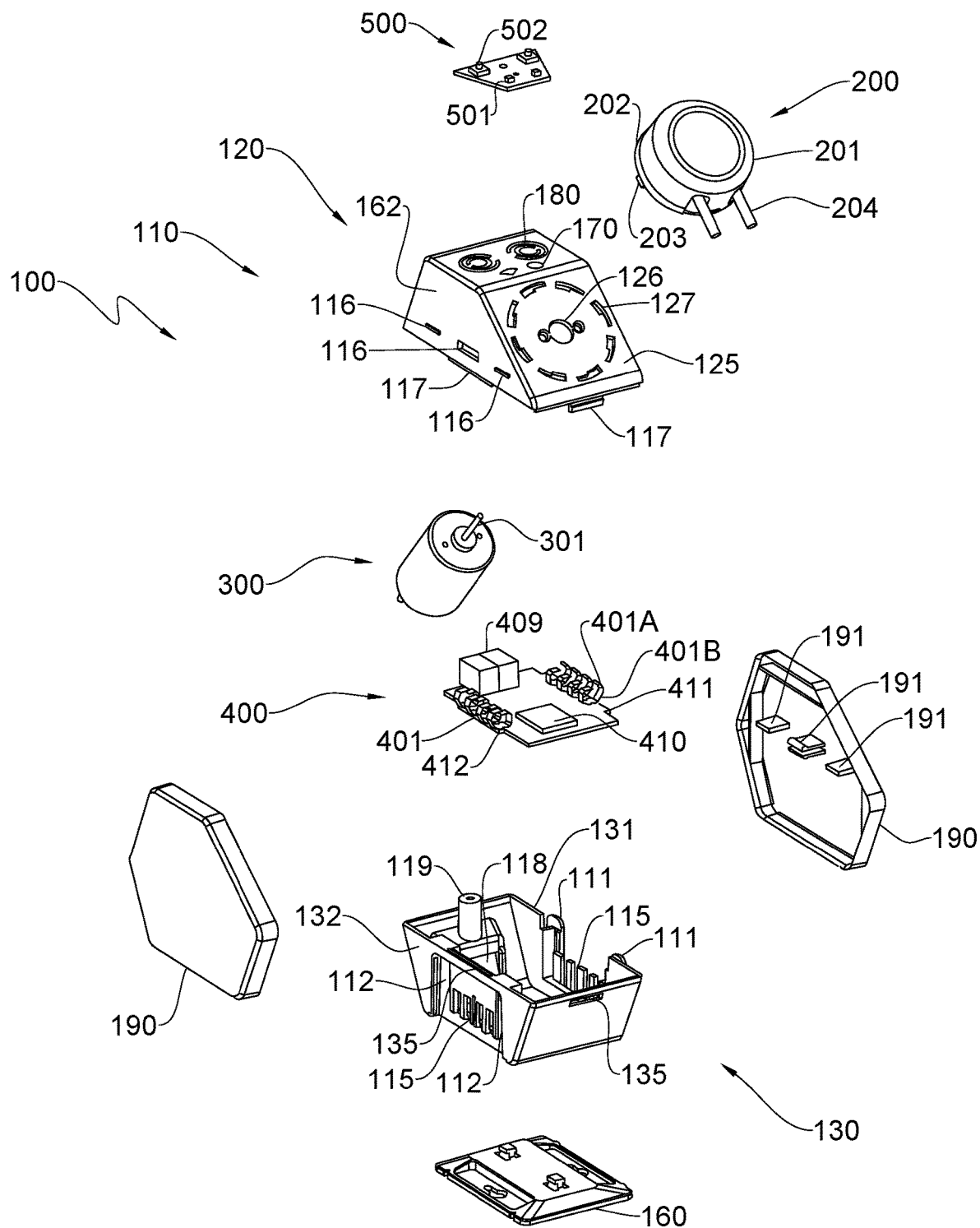
FIG. 2 is an exploded view of the metering unit.

There is advantageously received on the printed circuit board 400 a microprocessor 410 which can be seen in FIG. 2 and which is suitable for controlling the metering unit 100, in particular by activating or deactivating the supply of the substance to the tank of the aquarium. The microprocessor 410 receives the values measured by a sensor which is not depicted and which preferably measures values connected with the substance, which is intended to be supplied and which is dissolved in the tank of the aquarium, for example, the concentration thereof. Advantageously, the microprocessor 410 is connected to a transmission unit which is not depicted and which is suitable for interfacing with a network access device 602 and to allow the metering unit 100 and in particular the microprocessor 410 to be connected to the Internet. The network access device 602 may be, for example, a WiFi router. Preferably, the transmission unit comprises an electronic control unit with wireless communication via WiFi and it is positioned inside the containment box 110. As a result of the Internet connection, the microprocessor 410 is capable of transferring the value measured by the sensor to a cloud.

The term "cloud" is intended to be understood to refer to the technology which allows data to be processed and archived on a network and which, via the internet, allows access to be afforded to applications and data which are stored on a remote hardware item instead of on the local workstation.

The value measured by the sensor, once transferred to the cloud, becomes accessible by a control device 603, which is connected to the Internet, for example, a computer or a Smartphone. Preferably, the control device is capable of being connected to the Internet and therefore to the cloud using the network access device 602. Alternatively, the control device 603 is capable of being connected to the Internet and therefore to the cloud by means of a data network, for example, a sim of a mobile telephone.

According to another aspect of the invention, the control device 603 is provided with a software item on which there is installed an application which allows the remote control of the metering unit 100. Preferably, the user may consult by means of the application the ideal values of the parameters in relation to the substance which is intended to be supplied, for example, the quantity, times of day, repetitions, etc., for the correct administration of the substance itself in the aquarium. The ideal values can vary on the basis of the type of aquarium and the volume of water: advantageously, the user can impose the type of aquarium and the volume of water by means of the application. The ideal values are advantageously organized into ranges of ideal values.

The ideal values of the parameters of the substance, which is intended to be supplied, are preferably stored in a database. The database is advantageously stored in a server 604 which is connected to the cloud and which is suitable for sharing on the cloud the values stored in the database. The control device 603 is capable of being connected to the Internet and therefore to the cloud, where it can access the values stored in the database.

Alternatively, it is possible for the database to be pre-installed on the software of the control device 603.

According to another aspect of the invention, the control device 603 comprises a scanning device which is not illustrated and which is suitable for identifying the type of substance to be metered, for example, by means of bar codes or QR codes. Once the substance to be metered has been identified, the control device 603 can access the database and provide the user with the ideal values of the parameters in relation to the substance defined by the scanning device.

In some embodiments, the values of the parameters in relation to the substance to be metered may be modified.

In the preferred embodiment of the invention, the values of the parameters in relation to the substance to be metered are modified automatically by means of an administration algorithm of the microprocessor 401. Preferably, the algorithm compares the value measured by the sensor with the ideal values stored in the database. Advantageously, the algorithm is suitable for activating and deactivating the supply of the substance to be metered for a predetermined time period in order to bring the measured value into a range of ideal values, which are stored in the database. If the measured value is less than the range of ideal values, the microprocessor 410 will instruct the metering unit 100 to supply the substance to the tank of the aquarium 1. If the value measured is greater than the range of ideal values, the microprocessor 410 will instruct the metering unit 100 to interrupt the supply of the substance to the tank of the aquarium. Therefore, the algorithm allows the metering unit 100 to start or interrupt the supply of the substance to the tank of the aquarium in order to maintain the measured value in the range of ideal values stored in the database. Even more preferably, the algorithm also takes account of the volume of water contained in the tank of the aquarium in order to further modify the ideal values: the greater the volume of water, the greater the ideal values will be, and vice versa.

In other embodiments, the control device 603 allows the user to manually impose the values of the parameters in relation to the substance to be metered. The values modified by means of the software of the application installed on the control device 603 are sent to the cloud and subsequently read by the microprocessor 410, which instructs the metering unit 100 on the basis of the above-mentioned modified values. Preferably, the application installed in the control device 603 provides an alert message for the user if the modified value is outside the range of ideal values saved in the database.

The invention claimed is:

1. A metering unit (100) for the controlled supply of a substance inside an aquarium tank (10), comprising:
    a containment box (110);
    a dosimetric pump (200) which is actuated by an electric motor (300), both being associated with the containment box (110); and a printed circuit board (400) which is positioned in the containment box (110), the printed circuit board (400) comprising at least one electrical contact (401) which faces at least one opening (115) which is present in the containment box (110) in such a manner that the at least one electrical contact (401) of the metering unit (100) is associated with a respective electrical contact of a similar metering unit;

the containment box (110) having at least a first connection element (111) and at least a second connection element (112) connectable to a corresponding first connection element (111) of an additional similar metering unit in such a manner that the metering unit (100) can be connected in a modular manner to the additional similar metering unit, wherein there are present on a first end (411) of the printed circuit board (400) a plurality of electrical contacts (401) which face respective openings (115) in the containment box (110), the electrical contacts (401) on the first end being in numbers corresponding to the respective openings (115), and, on a second end (412) of the printed circuit board (400), a plurality of electrical contacts (401) which face respective openings (115) in the containment box (110), the electrical contacts (401) on the second end being in numbers corresponding to the respective openings (115).

2. The metering unit (100) according to claim 1, wherein the containment box (110) comprises an upper shell (120) and a lower shell (130).

3. The metering unit (100) according to claim 2, wherein the at least one first connection element (111) is constructed on a first lateral surface (131) of the lower shell (130) and the at least one second connection element (112) is constructed on a second lateral surface (132) of the lower shell (130).

4. The metering unit (100) according to claim 1, wherein the at least one first connection element (111) is a male connection element and the at least one second connection element (112) is a female connection element.

5. The metering unit (100) according to claim 1, wherein there are present two first connection elements (111) and two second connection elements (112).

6. The metering unit (100) according to claim 1, wherein the printed circuit board (400) is connected to a secondary printed circuit board (500) which comprises at least one LED (501) and at least one push-button (502).

7. The metering unit (100) according to claim 1, wherein the containment box (110) has at least one removable lateral cover (190).

8. The metering unit (100) according to claim 1, wherein the printed circuit board (400) comprises a microprocessor (410) which is configured to receive values, from a sensor, connected with the substance to be supplied in a state dissolved in the aquarium tank and to transmit the values to a cloud, where said values become accessible from a control device (603).

9. The metering unit (100) according to claim 8, wherein the control device (603) is configured so as to access a database, having stored therein, ideal values of parameters relating to the substance to be supplied.

10. The metering unit (100) according to claim 9, wherein the control device (603) comprises a scanning device configured to identify a type of substance to be metered.

11. The metering unit (100) according to claim 9, wherein the values of the parameters relating to the substance to be metered are modified automatically by an administration algorithm of the microprocessor (410), wherein the algorithm is configured to activate or deactivate the supply of the substance to be metered for a predetermined period of time, in order to maintain the value which is measured by the sensor within a range of ideal values which are stored in the database.

12. The metering unit (100) according to claim 1, wherein the dosimetric pump (200) comprises a support (202) and a head (201), wherein the support (202) is connectable to the containment box (110) in different positions in such a manner that the head (201) can rotate with respect to the containment box (110).

13. The metering unit (100) according to claim 12, wherein the head (201) comprises a flexible tube (204) therein, which is bent into a U-shape and the ends of which project towards the outer side of the dosimetric pump (200).

14. The metering unit (100) according to claim 12, wherein the electric motor (300) comprises a shaft (301) which is connected to a rotor with which there are associated rollers which throttle respective sections of a flexible tube (204), allowing the circulation of the substance which is intended to be introduced into the tank of the aquarium.

15. The metering unit (100) according to claim 12, wherein ends of the flexible tube (204) are connected to respective extensions (204A, 204B) which are configured to be inserted in an aquarium tank (10) and in a respective container (11), in which substances to be supplied are contained, respectively.

16. The metering unit (100) according to claim 1, wherein the dosimetric pump (200) is a peristaltic pump.

17. A metering group comprising a plurality of metering units (100) according to claim 1, which are or can be connected by the first connection elements (111) and the second connection elements (112).

18. A metering unit (100) for the controlled supply of a substance inside an aquarium tank (10), comprising:
  a containment box (110);
  a dosimetric pump (200) which is actuated by an electric motor (300), both being associated with the containment box (110); and
  a printed circuit board (400) which is positioned in the containment box (110), the printed circuit board (400) comprising at least one electrical contact (401) which faces at least one opening (115) which is present in the containment box (110) in such a manner that the at least one electrical contact (401) of the metering unit (100) is associated with a respective electrical contact of a similar metering unit;
  the containment box (110) having at least a first connection element (111) and at least a second connection element (112) connectable to a corresponding first connection element (111) of an additional similar metering unit in such a manner that the metering unit (100) can be connected in a modular manner to the additional similar metering unit,
wherein the at least one contact (401) is configured so as to project from the respective opening (115) over a variable distance in a connection direction of the metering unit with the additional similar metering unit, the connection direction being defined by the development of the connection elements (111, 112).

* * * * *